(12) United States Patent
Lee

(10) Patent No.: US 7,839,179 B2
(45) Date of Patent: Nov. 23, 2010

(54) BALANCED PHASE DETECTOR

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 222 days.

(21) Appl. No.: 11/762,557

(22) Filed: Jun. 13, 2007

(65) Prior Publication Data

US 2008/0309377 A1 Dec. 18, 2008

(51) Int. Cl.
*G01R 25/00* (2006.01)
(52) U.S. Cl. ......................................................... 327/12
(58) Field of Classification Search ........................ None
See application file for complete search history.

(56) References Cited

U.S. PATENT DOCUMENTS

| | | | |
|---|---|---|---|
| 4,398,105 A | 8/1983 | Keller | |
| 5,942,926 A * | 8/1999 | Yamaguchi | 327/156 |
| 6,617,901 B1 * | 9/2003 | Kuhn | 327/202 |
| 6,779,126 B1 | 8/2004 | Lin et al. | |
| 6,987,701 B2 | 1/2006 | Lin et al. | |
| 7,078,938 B2 | 7/2006 | Kim | |
| 7,119,583 B2 | 10/2006 | Johnson et al. | |
| 7,123,525 B2 | 10/2006 | Lin et al. | |
| 7,161,391 B2 | 1/2007 | Lin | |
| 2008/0130396 A1 * | 6/2008 | Gomm et al. | 365/233.11 |

* cited by examiner

*Primary Examiner*—Lincoln Donovan
*Assistant Examiner*—Khareem E Almo
(74) *Attorney, Agent, or Firm*—Knobbe, Martens, Olson & Bear LLP

(57) ABSTRACT

Methods and apparatus are disclosed, such as those involving a digital phase detector that includes a phase detection circuit configured to detect which one of two clock signals leads the other. One such phase detector includes a balancer configured to prepare the phase detection circuit for a phase detection. The phase detection circuit of one or more embodiments includes a cross-coupled latch configured to receive the two clock signals and generate a first latch output and a second latch output in response to the two clock signals. The aforementioned balancer is configured to substantially equalize the voltage levels of the first and second latch outputs before the phase detection circuit detects a phase difference between the two clock signals. For example, the balancer might precharge the outputs of the phase detection circuit to substantially the same voltage level before phase detection.

22 Claims, 6 Drawing Sheets

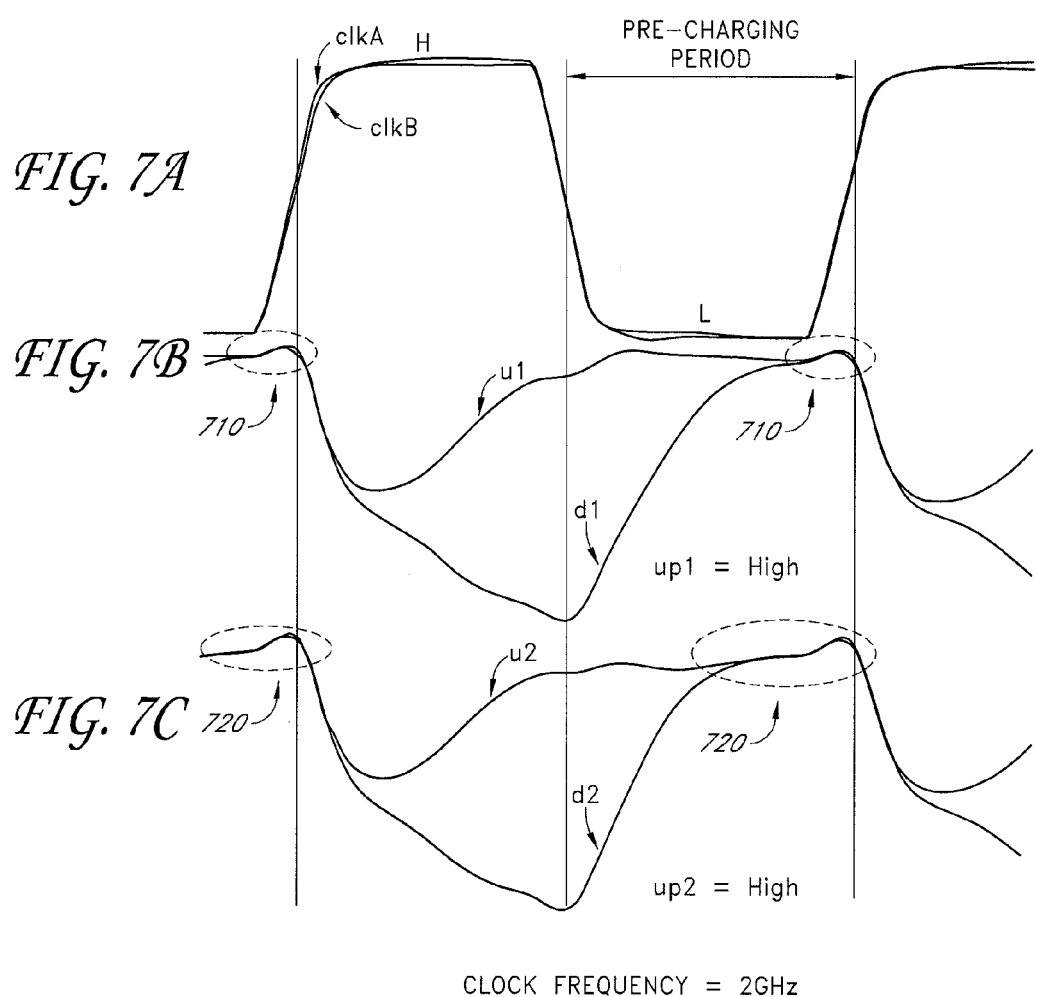

CLOCK FREQUENCY = 3GHz

BALANCED PHASE DETECTOR

BACKGROUND OF THE INVENTION

1. Field of the Invention

Embodiments of the invention relate to phase detectors, and more particularly, in one or more embodiments, to digital phase detectors.

2. Description of the Related Art

Phase detectors serve to detect a phase difference between two signals. Phase detectors have wide applications in various electronic devices. Phase detectors are often used for high-speed electronic devices, such as synchronous DRAM. Phase detectors are often part of phase-locked loop (PLL) systems or delay-locked loop (DLL) systems.

FIG. 1 illustrates a conventional digital phase detector 100. The phase detector 100 is configured to detect which one of two clock signals is leading the other. The phase detector 100 includes a phase detection circuit 101 and an output circuit 102. The phase detection circuit 101 can be implemented with a first RS latch 110 configured to receive two clock signals clkA, clkB, and detect which clock signal is leading or lagging the other. The output circuit 102 can be implemented with a second RS latch 120 configured to maintain the outputs from the phase detection circuit and provide an output signal indicative of which clock signal is leading. The first and second RS latches 110, 120 can be connected to form cascaded RS latches.

The first RS latch 110 includes a first NAND gate 111 and a second NAND gate 112, which are cross-coupled to generate positive feedback. The first NAND gate 111 has a first input 111a, a second input 111b, and an output d1. The second NAND gate 112 has a first input 112a, a second input 112b, and an output u1. The first input 111a of the first NAND gate 111 receives a first clock signal clkA. The second input 111b of the first NAND gate 111 receives the output signal u1 from the second NAND gate 112. The first input 112a of the second NAND gate 112 receives the output signal d1 from the first NAND gate 111. The second input 112b of the second NAND gate 112 receives a second clock signal clkB.

The second RS latch 120 includes a third NAND gate 121 and a fourth NAND gate 122 cross-coupled with each other. The third NAND gate 121 has a first input 121a, a second input 121b, and an output up1. The fourth NAND gate 122 has a first input 122a, a second input 122b, and an output 122c. The first input 121a of the third NAND gate 121 receives the output signal d1 from the first NAND gate 111 of the first RS latch 110. The second input 121b of the third NAND gate 111 receives the output signal 122c from the fourth NAND gate 122. The first input 122a of the fourth NAND gate 122 receives the output signal up1 from the third NAND gate 121. The second input 122b of the fourth NAND gate 122 receives the output signal u1 from the second NAND gate 112 of the first RS latch 110.

With reference to FIGS. 1 and 2, the operation of the conventional phase detector 100 will be described. The illustrated phase detector 100 performs phase detection for rising edges of the first and second clock signals clkA, clkB. Initially, both of the inputs 111a, 112b of the first RS latch 110 are low, and thus both of the outputs d1, u1 thereof are high. When one of the clock signals clkA, clkB rises prior to the other, the output of the NAND gate 111 or 112 receiving the leading clock signal falls first. This in turn feeds back to the input of the other NAND gate, forcing its output to remain high, regardless of whether the other clock signal rises thereafter. Thus, the state of the outputs d1, u1 can indicate which one of the two clock signals leads the other. Then, when the leading clock signal falls, the output of the NAND gate receiving the leading clock signal rises, thereby preparing the first RS latch 110 for another phase detection. Before phase detection, the phase detector 100 should pre-charge the outputs d1, u1 of the phase detection circuit 101 to substantially the same voltage level because phase detection depends on which one of the outputs d1, u1 of the first RS latch 110 goes low first.

In the illustrated timing diagram of FIG. 2, during pre-charging periods, both the first and second clock signals clkA, clkB are low (L). In the timing diagram, the horizontal axis represents time which increases to the right. Because the clock signal inputs clkA, clkB to the NAND gates 111, 112 are low, the outputs d1, u1 of the first RS latch 110 are pre-charged to a high (H) level (e.g., the power supply voltage level Vcc of the NAND gates 111, 112). During the pre-charging periods, the output up1 of the third NAND gate 121 is either high or low, depending on the previous phase detection result.

When one of the NAND gates 111, 112 receives a clock signal clkA or clkB leading the other, that NAND gate outputs a low while the other NAND gate outputs a high. In the illustrated timing diagram of FIG. 2, the first clock signal clkA starts rising at time t1, leading the rising of the second clock signal clkB. When the first clock signal clkA goes beyond a certain voltage threshold, the output d1 of the first NAND gate 111 starts falling. The second clock signal clkB starts rising at time t2. In the illustrated timing diagram, time t2 occurs soon after time t1, before the output d1 has transitioned. Similar to the operation of the output d1 of the first NAND gate 111, when the second clock signal clkB transitions beyond a certain voltage threshold, the output signal u1 of the second NAND gate 112 starts falling (assuming that the output 112a is still high). However, at time t3, the output signal d1 of the first NAND gate 111 goes low first, and maintains the output signal u1 of the second NAND gate 112 high.

The second RS latch 120 receives the output signals d1, u1 from the first RS latch 110, and changes its output depending on the output signals d1, u1. In the illustrated timing diagram, the output signal d1 of the first NAND gate 111 goes low whereas the output signal u1 of the second NAND gate 112 is kept high. The third NAND gate 121 outputs a high signal because d1 is low. The fourth NAND gate 122 outputs a low signal because both inputs to the fourth NAND gate 122 are high. The output up1 of the third NAND gate 121 is high to indicate that the first clock signal clkA leads the second clock signal clkB. On the other hand, if the second clock signal clkB leads the first clock signal clkA, the output up1 of the third NAND gate 121 is low to provide the phase detection indication.

In certain devices, the phase detector 100 can be used for high frequency clock signals. In such cases, the higher the frequency is, the shorter a period of time for which both the first and second clock signal clkA, clkB are low. If the period is shorter than the time needed for sufficiently pre-charging both outputs d1, u1 to the same voltage level, the phase detection results may not be reliable. Therefore, there is a need to provide a phase detector that can operate reliably at relatively high frequencies.

BRIEF DESCRIPTION OF THE DRAWINGS

The embodiments will be better understood from the Detailed Description of Embodiments and from the appended drawings, which are meant to illustrate and not to limit the embodiments, and wherein:

FIGS. 7A-7C are graphs illustrating the waveforms of the phase detectors of FIGS. 1 and 3 resulting from a simulation at a frequency of 2 GHz;

DETAILED DESCRIPTION OF EMBODIMENTS

In one embodiment, a phase detector includes a phase detection circuit, an output circuit, and a balancer. The balancer is configured to equalize the outputs of the phase detection circuit to substantially the same voltage level during a pre-charging period to prepare the phase detection circuit for phase detection.

Figure 3:
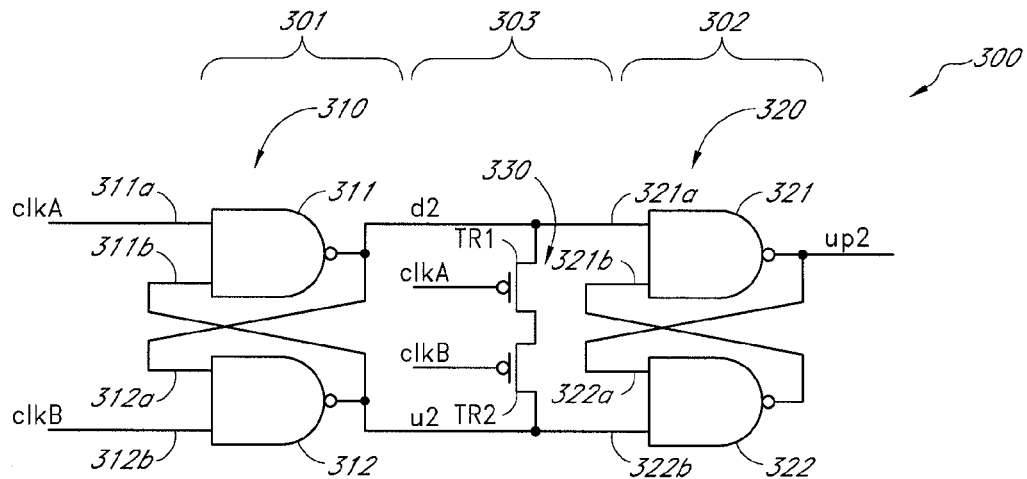
FIG. 3 is a schematic block diagram of a phase detector according to one embodiment.

FIG. 3 illustrates a digital phase detector 300 according to one embodiment. The illustrated phase detector 300 is configured to detect which rising edge from two clock signals is leading the other. It will be understood that the digital phase detector 300 can be readily modified to detect differences in phase for falling edges. The phase detector 300 includes a phase detection circuit 301, an output circuit 302, and a balancer 303.

Figure 9:
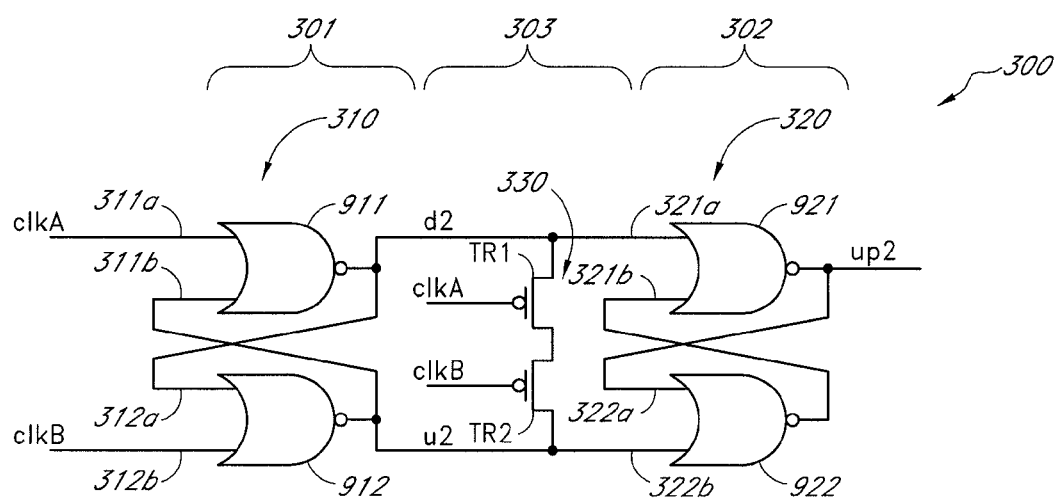
FIG. 9 is a schematic block diagram of a phase detector according to yet another embodiment.

The phase detection circuit 301 can be implemented with a first RS latch 310 to provide phase detection between two clock signals. It will be understood that the phase detection circuit 301 can be embodied by other circuits that will be readily determined by one of ordinary skill in the art. The illustrated first RS latch 310 receives two clock signals clkA, clkB, and is configured to detect which clock signal is leading or lagging the other. The illustrated first RS latch 310 includes a first NAND gate 311 and a second NAND gate 312 cross-coupled with each other. In other embodiments, the first RS latch can include two cross-coupled NOR gates (for example, NOR gates 911, 912 shown in FIG. 9). The configurations of the first NAND gate 311 and the second NAND gate 312 can be as described above with respect to those of the first NAND gate 111 and the second NAND gate 112 of FIG. 1. The first NAND gate 311 receives a first clock signal clkA and outputs a first output signal d2. The second NAND gate 312 receives a second clock signal clkB and outputs a second output signal u2.

The output circuit 302 can be implemented with a second RS latch 320. The second RS latch 320 is configured to maintain the result of the phase detection at the first RS latch 310 and provide an output signal indicative of which clock signal is leading. The second RS latch 320 includes a third NAND gate 321 and a fourth NAND gate 322 cross-coupled with each other. In other embodiments, the second RS latch 320 can include two cross-coupled NOR gates (for example, NOR gates 921, 922 shown in FIG. 9). The configurations of the third NAND gate 321 and the fourth NAND gate 322 can be as described above with respect to those of the third NAND gate 121 and the fourth NAND gate 122 of FIG. 1. The third NAND gate 321 receives the first output signal d2 from the first NAND gate 311 and provides an output signal up2. The fourth NAND gate 322 receives the second output signal u2 from the second NAND gate 312 and provides an output signal to the third NAND gate 321.

The balancer 303 is configured to pre-charge the outputs d2, u2 of the first and second NAND gates 311, 312 to substantially the same voltage level during a pre-charging period during which both the first and second clock signals clkA, clkB are low. The illustrated balancer 303 includes a switch 330. The switch 330 can include a first transistor TR1 and a second transistor TR2. In the illustrated embodiment, the first and second transistors TR1, TR2 are PMOS transistors. In other embodiments, the first and second transistors TR1, TR2 can be NMOS transistors or a combination of NMOS and PMOS transistors, depending on the circuit.

The first transistor TR1 can have a first source/drain, a first drain/source, and a first gate. The second PMOS transistor TR2 can have a second source/drain, a second drain/source, and a second gate. A skilled artisan will appreciate that the source and drain of each of the transistors TR1, TR2 can be swapped in many low voltage ICs. The first source/drain of the first transistor TR1 is connected to the output d2 of the first NAND gate 311. The first drain/source of the first transistor TR1 is connected to the source/drain of the second transistor TR2. The first gate of the first transistor TR1 is configured to receive the first clock signal clkA. The second drain/source of the second transistor TR2 is connected to the output u2 of the second NAND gate 312. The second gate of the second transistor TR2 is configured to receive the second clock signal clkB. In another embodiment, the first clock signal clkA can be supplied to the gate of the second transistor TR2 and the second clock signal clkB can be supplied to the gate of the first transistor TR1.

The phase detector 300 can operate in a manner similar to that in which the conventional phase detector 100 operates. However, during pre-charging periods (periods for which both the first and second clock signals clkA, clkB are low), the first and second transistors TR1, TR2 are on, thus electrically connecting the outputs d2, u2 of the first RS latch 310. This configuration allows the two outputs d2, u1 to be at substantially the same voltage level before subsequent phase detection. When either of the first and second clock signals clkA, clkB rises, a corresponding one of the first and second transistors TR1, TR2 is turned off, disconnecting the outputs d2, u2 of the first NAND latch 310 from each other. The first RS latch 310 can operate in a manner similar to that in which the first RS latch 110 of FIG. 1 operates. Because the two outputs d2, u2 can be reliably pre-charged to substantially the same voltage level, the phase detector 300 can provide reliable phase detection, regardless of frequency.

A skilled artisan will appreciate that each of the phase detection circuit 301 and the output circuit 302 can include various other types of logic gates (e.g., NOR gates) or electronic components, depending on the circuit design. In addition, the phase detector 300 can further include other electronic circuits or components suitable for processing phase detection results or interfacing with other devices.

Figure 4:
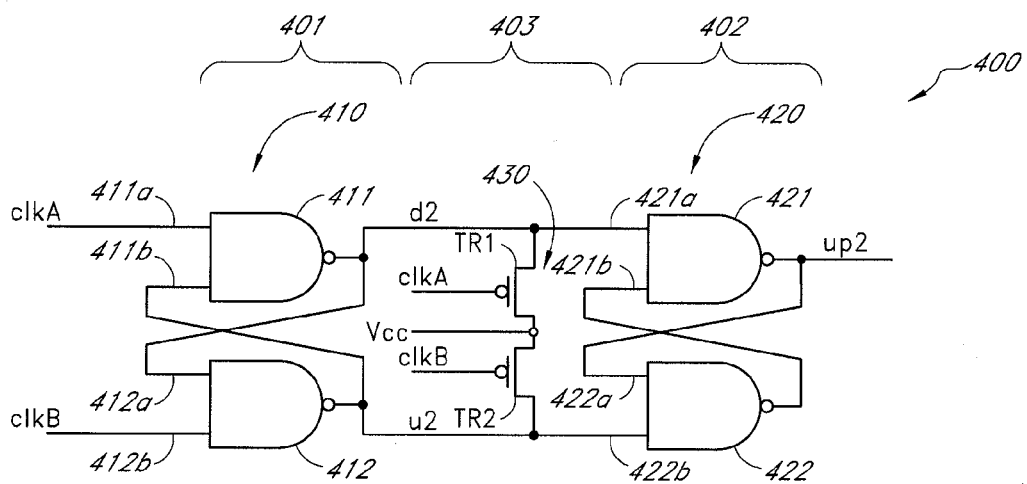
FIG. 4 is a schematic block diagram of a phase detector according to another embodiment.

FIG. 4 illustrates a digital phase detector 400 according to another embodiment. The phase detector 400 is configured to detect which one of two clock signals is leading the other (rising edge). The phase detector 400 includes a phase detection circuit 401, an output circuit 402, and a balancer 403. The phase detection circuit 401 includes a first RS latch 410. The output circuit 402 includes a second RS latch 420. The two RS latches 410, 420 are connected to form cascaded latches. The first and second RS latches 410, 420 can have the same configurations as those of the first and second RS latches 310, 320 of FIG. 3.

The balancer 403 is configured to pre-charge the outputs d2, u2 of the first RS latch 410 to the same voltage level during pre-charging periods. The illustrated balancer 403 is a switch including a first transistor TR1 and a second transistor TR2. In the illustrated embodiment, the first and second transistors TR1, TR2 are PMOS transistors. In other embodiments, the first and second transistors TR1, TR2 can be NMOS transistors or a combination of NMOS and PMOS transistors. The configurations of the first and second transistors TR1, TR2 can be the same as those of the first and second transistor TR1, TR2 of FIG. 3 except that the first drain/source of the first transistor TR1 and the second source/drain of the second transistor TR2 are both connected to a voltage source Vcc.

The phase detector 400 can operate in a manner similar to that in which the phase detector 300 operates. During a pre-charging period, the first and second transistors TR1, TR2 are on, thus electrically connecting the outputs d2, u2 of the first RS latch 410 to the voltage source Vcc. This configuration allows the two outputs d2, u2 to be at substantially the same voltage level (Vcc in the illustrated embodiment) before the first and second clock signals clkA, clkB have rising edges. When the first and second clock signals clkA, clkB rise, corresponding ones of the first and second transistors TR1, TR2 are turned off, disconnecting the outputs d2, u2 of the first NAND latch 410 from the voltage source Vcc. The first RS latch 410 can operate in a manner similar to that in which the first RS latch 310 of FIG. 3 operates. Because the two outputs d2, u2 can be reliably pre-charged to substantially the same voltage level, the phase detector 400 can provide reliable phase detection, regardless of frequency.

Figure 5:
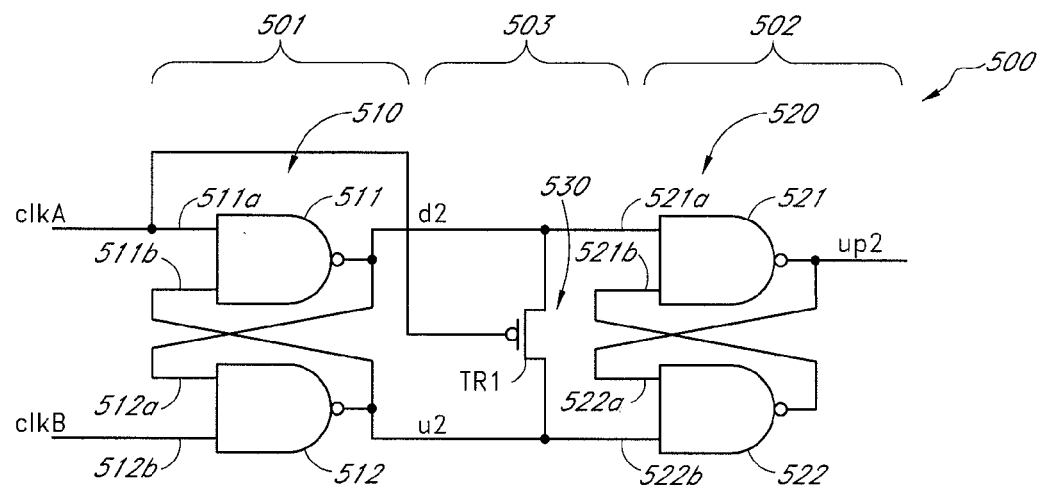
FIG. 5 is a schematic block diagram of a phase detector according to yet another embodiment.

FIG. 5 illustrates a digital phase detector 500 according to yet another embodiment. The phase detector 500 is configured to detect which one of two clock signals is leading the other. The phase detector 500 includes a phase detection circuit 501, an output circuit 502, and a balancer 503. The phase detection circuit 501 includes a first RS latch 510. The output circuit 502 includes a second RS latch 520. The two RS latches 510, 520 are connected to form cascaded latches. The first and second RS latches 510, 520 can have the same configurations as those of the first and second RS latches 310, 320 of FIG. 3.

The balancer 503 is configured to pre-charge the outputs d2, u2 of the first RS latch 510 to substantially the same voltage level during pre-charging periods. The illustrated balancer 503 is a switch 530 including a single PMOS transistor TR1. In other embodiments, the switch 530 can include a single NMOS transistor. The transistor TR1 can have a source/drain, a drain/source, and a gate. The source/drain of the transistor TR1 is connected to the output of the first NAND gate 511. The drain/source of the transistor TR1 is connected to the output of the second NAND gate 512. The gate of the transistor TR1 is configured to receive the first clock signal clkA. In another embodiment, the gate of the transistor TR1 can be configured to receive the second clock signal clkB instead of the first clock signal clkB, depending on the circuit design. In yet another embodiment, the switch 530 can include two PMOS or NMOS transistors connected in parallel between the outputs d2, u2 of the first RS latch 510. The source/drain of each of the transistors is connected to the output d2 of the first NAND gate 511. The drain/source of each of the transistors is connected to the output u2 of the second NAND gate 512. The gate of one of the transistors is configured to receive the first clock signal clkA. The gate of the other of the transistors is configured to receive the second clock signal clkB.

The phase detector 500 can operate in a manner similar to that in which the phase detector 300 operates. During pre-charging periods, the transistor TR1 is on, thus electrically shorting the outputs d2, u2 of the first RS latch 510. This configuration allows the two outputs d2, u2 to be at substantially the same voltage level before the first clock signal clkA rises. When the first clock signal clkA rises, the transistor TR1 is turned off, disconnecting the outputs d2, u2 of the first RS latch 510 from each other. Then, the first RS latch 510 can operate in a manner similar to that in which the first RS latch 310 of FIG. 3 operates. In an instance where the second clock signal clkB leads the first clock signal clkA, the first RS latch 510 can start operating with a slight delay at the rise of the first clock signal clkA. Because the two outputs d2, u2 can be reliably pre-charged to substantially the same voltage level, the phase detector 500 can provide reliable phase detection regardless of frequency.

Figure 6:
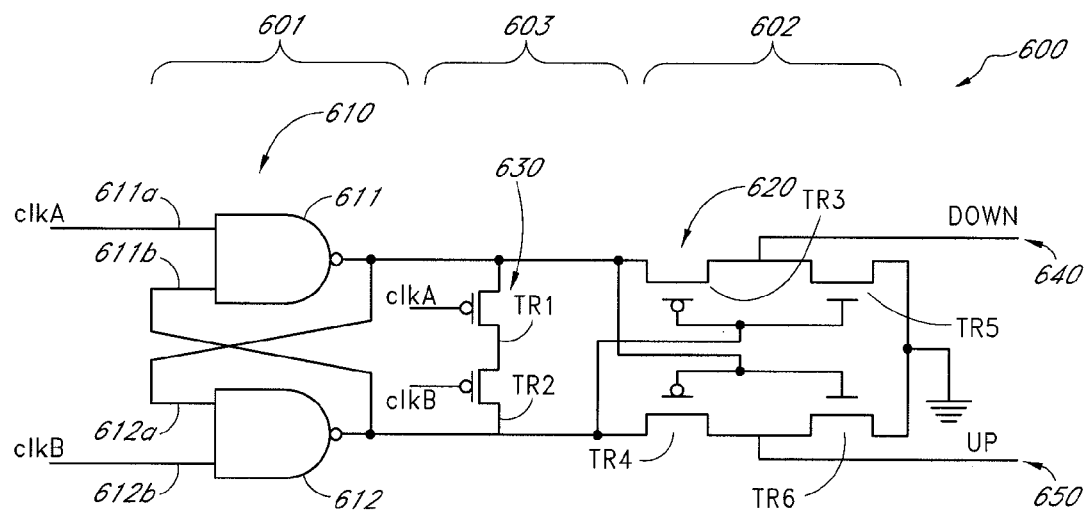
FIG. 6 is a schematic block diagram of a phase detector according to yet another embodiment.

FIG. 6 illustrates a digital phase detector 600 according to yet another embodiment. The phase detector 600 is configured to detect which one of two clock signals is leading the other. The phase detector 600 includes a phase detection circuit 601, an output circuit 602, and a balancer 603.

The phase detection circuit 601 includes an RS latch 610. The illustrated RS latch 610 includes a first NAND gate 611 and a second NAND gate 612 cross-coupled with each other. The illustrated balancer 603 is a switch including a first transistor TR1 and a second transistor TR2. The RS latch 610 and the switch 630 can have the same configurations as those of the first RS latch 310 and the switch 330, respectively, of FIG. 3. In other embodiments, the balancer 603 can have one of the configurations described earlier in connection with FIGS. 4 and 5.

The output circuit 602 is configured to produce an UP signal and a DOWN signal in a manner such that at rising edges, the UP signal and the DOWN signal cannot be at the same level at the same time. For example, if a first clock signal clkA leads a second clock signal clkB, the UP signal is high and the DOWN signal is low, and vice versa.

The illustrated output circuit 602 is a transistor circuit 620 including third, fourth, fifth, sixth transistors TR3, TR4, TR5, TR6, a first output 640, and a second output 650. In the illustrated embodiment, the third and fourth transistors TR3, TR4 are PMOS transistors whereas the fifth and sixth transistors TR5, TR6 are NMOS transistors. However, a skilled artisan will appreciate that the transistors can have different polarity, depending on the circuit design.

The third transistor TR3 has a source/drain connected to the output d2 of the first NAND gate 611, a drain/source connected to the first output 640, and a gate connected to the output u2 of the second NAND gate 612. The fourth transistor TR4 has a source/drain connected to the output u2 of the second NAND gate 612, a drain/source connected to the second output 650, and a gate connected to the output d2 of the first NAND gate 611. The fifth transistor TR5 includes a source/drain connected to the drain/source of the third transistor TR3, a drain/source connected to ground, and a gate connected to the gate of the third transistor TR3. The sixth transistor TR6 includes a source/drain connected to the drain/source of the fourth transistor TR4, a drain/source connected to ground, and a gate connected to the gate of the fourth transistor TR4.

In the illustrated embodiment, the RS latch 610 and the switch 630 operate in the same manner as that in which the first NAND latch 310 and the switch 330 operate. During pre-charging periods, the outputs of both the first NAND gate 611 and the second NAND gate 612 are high, thereby keeping the UP and DOWN signals low. If the first clock signal clkA leads the second clock signal clkB, the output of the first NAND gate 611 goes low whereas the output of the second NAND gate 612 stays high. At this state, the third transistor TR3 is off, and the fifth transistor TR5 is on, thereby keeping the DOWN signal low. The fourth transistor TR4 is turned on and the sixth transistor TR6 is turned off, thereby producing a high UP signal. If the second clock signal clkB leads the first clock signal clkA, a low UP signal and a high DOWN signal are produced.

After both of the clock signals clkA, clkB fall low, the switch 630 is turned on, thereby electrically connecting the outputs of the RS latch 610. This configuration permits the two outputs of the RS latch 610 to be reliably pre-charged to substantially the same voltage level. Thus, the phase detector 600 can provide reliable phase detection regardless of frequency.

In the embodiments described above, three configurations of balancers are shown and described. A skilled artisan will, however, appreciate that various other configurations of balancers providing the same function can also be used with the phase detector.

Figure 1:
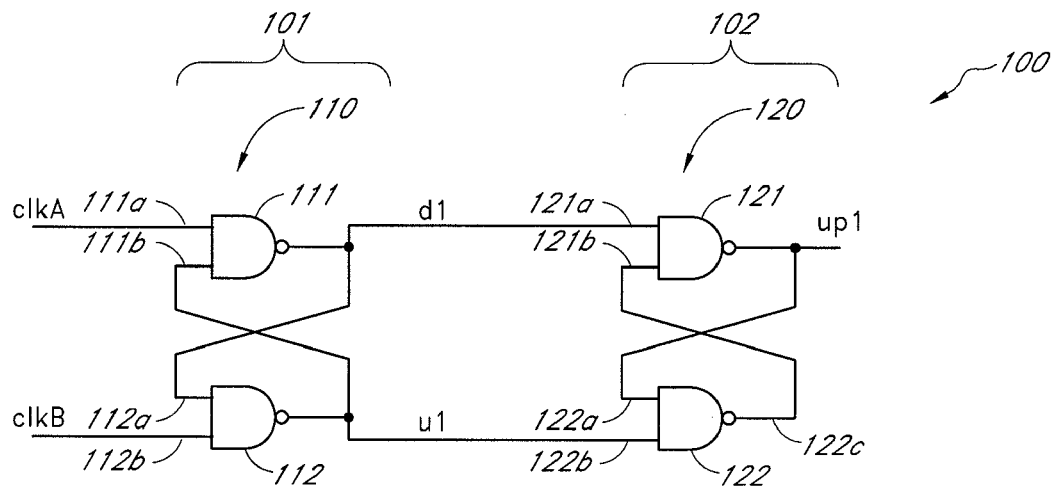
FIG. 1 is a schematic block diagram of a conventional phase detector.
Figure 2:
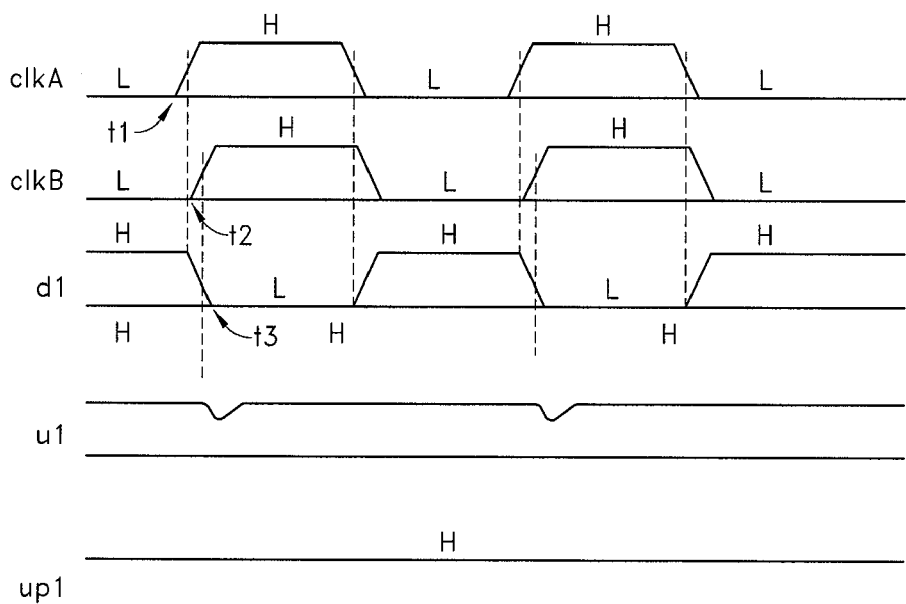
FIG. 2 is a timing diagram illustrating the operation of the conventional phase detector of FIG. 1.

FIGS. 7A-7C are graphs illustrating the waveforms of the phase detectors of FIGS. 1 and 3 resulting from a simulation using clock signals having a frequency of 2 GHz. FIG. 7A shows waveforms of first and second input clock signals clkA, clkB. In the illustrated simulation, the first clock signal clkA is leading the second clock signal clkB. FIG. 7B illustrates waveforms of the output signals d1, u1 from the phase detection circuit 101 of FIG. 1. The resulting output signal up1 (not shown) from the output circuit 102 is high. FIG. 7C illustrates waveforms of the output signals d2, u2 from the phase detection circuit 301 of FIG. 3. The resulting output signal up2 (not shown) from the output circuit 302 is high. During pre-charging periods, the output signals u1, d1, u2, d2 of the phase detection circuits 101, 301 rise to substantially the same voltage level to be ready for subsequent phase detection. In the illustrated simulation at a frequency of 2 GHz, although there appears to be no phase detection error with either of the phase detectors 100, 300, the phase detector 300 of FIG. 3 equalizes the outputs of the phase detection circuit 301 more reliably than the phase detector 100 of FIG. 1 which does not use a balancer, as indicated by dotted circles 710, 810.

Figure 8A:
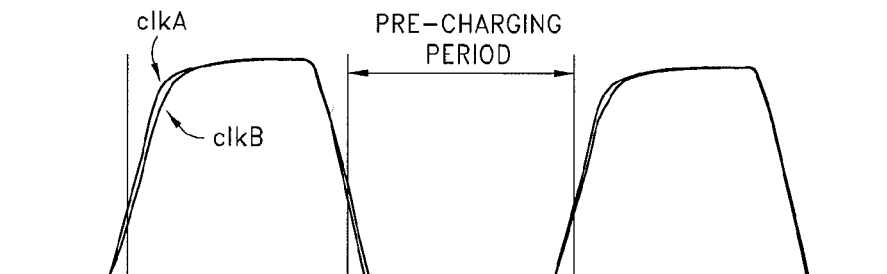
FIGS. 8A-8C are graphs illustrating the waveforms of the phase detectors of FIGS. 1 and 3 resulting from a simulation at a frequency of 3 GHz.
Figure 8B:
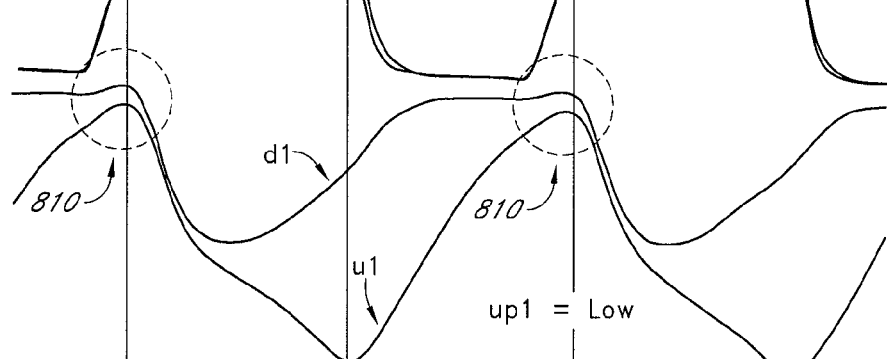
Figure 8C:
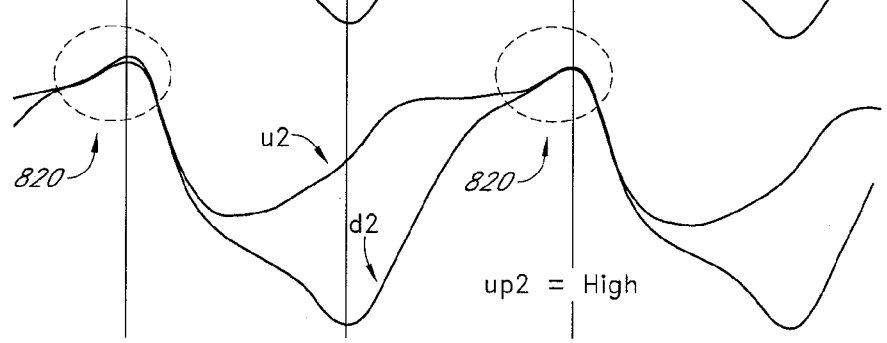

FIGS. 8A-8C are graphs illustrating the waveforms of the phase detectors of FIGS. 1 and 3 resulting from a simulation using clock signals having a frequency of 3 GHz. FIG. 8A shows waveforms of first and second input clock signals clkA, clkB. In the illustrated simulation, the first clock signal clkA is leading the second clock signal clkB. FIG. 8B illustrates waveforms of the output signals d1, u1 from the phase detection circuit 101 of FIG. 1. The resulting output signal up1 (not shown) from the output circuit 102 is low, which is an error. This error is incurred because the phase detector 100 fails to pre-charge the outputs of the phase detection circuit 101 to substantially the same voltage level during pre-charging periods, as indicated by dotted circles 810. FIG. 8C illustrates waveforms of the output signals d2, u2 from the phase detection circuit 301 of FIG. 3. The resulting output signal up2 from the output circuit 302 is high, which is a correct detection result. During pre-charging periods, the output signals u2, d2 of the phase detection circuit 301 can rise reliably to substantially the same voltage level to be ready for subsequent phase detection despite that the clock signals clkA, clkB have a high frequency, as indicated by dotted circles 820.

Thus, the phase detector of the embodiment described above can provide more reliable phase detection than the conventional phase detector, regardless of frequency of clock signals.

In the embodiments described above, the balancers can reliably pre-charge outputs of a phase detection circuit to substantially the same voltage level during pre-charging periods. This configuration provides reliable and accurate phase detection, regardless of the frequency of clock signals to be phase-detected.

The phase detectors of the embodiments described above can apply to various electronic devices. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, receiver circuits of optical networks or other communication networks, disk driver circuits, and serializer/deserializer (SerDes). The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

One embodiment is an apparatus including a phase detection circuit configured to detect a phase difference between at least two signals and to indicate the detection of the phase difference with output signals. The apparatus also includes a balancer configured to substantially equalize the voltage levels of the output signals before the phase detection circuit detects the phase difference.

Another embodiment is an apparatus including a phase detection circuit configured to detect a phase difference between two clock signals. The phase detection circuit includes a cross-coupled latch configured to receive the two clock signals and generate a first latch output and a second latch output in response to the two clock signals to indicate the detection of the phase difference. The apparatus further includes balancing means for substantially equalizing the voltage levels of the output signals from the phase detection circuit before the phase detection circuit detects the phase difference between the two clock signals.

Yet another embodiment is a method that includes receiving two clock signals in a cross-coupled latch. The cross-coupled latch includes a first latch output and a second latch output. A phase detection is indicated by relative output states of the first latch output and the second latch output. The method further includes electrically connecting the first and second latch outputs to each other and/or to a voltage source before each instance of the cross-coupled latch responding to the two clock signals.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. An apparatus comprising:
   a phase detection circuit configured to receive a first and a second input signal, wherein the phase detection circuit is configured to detect a phase difference between the first and the second input signal and to indicate the detection of the phase difference with output signals, the phase detection circuit comprising a cross-coupled latch, wherein the output signals of the phase detection circuit are directly coupled to inputs of the phase detection circuit; and
   a balancer independent of the phase detection circuit, the balancer having at least one input coupled to at least one of the first or the second input signal, wherein the balancer is configured to electrically couple the outputs of the cross-coupled latch of the phase detection circuit to each other in direct response to the at least one of the first or the second input signal that has not passed through the cross-coupled latch to substantially equalize the voltage levels of the output signals of the cross-coupled latch of the phase detection circuit.

2. The apparatus of claim 1, wherein the first and second input signal comprise clock signals.

3. The apparatus of claim 1, wherein the phase detection circuit is configured to detect which one of the first or the second input signal leads the other.

4. The apparatus of claim 1, wherein the phase detection circuit is configured to detect which one of the first or the second input signal lags the other.

5. The apparatus of claim 1, wherein the cross-coupled latch is configured to receive the first and the second input signal and generate a first latch output and a second latch output in response to waveforms of the first and the second input signal.

6. The apparatus of claim 1, wherein the balancer is configured to substantially equalize the voltage levels of the output signals of the cross-coupled latch by precharging the output signals of the cross-coupled latch to substantially the same voltage level.

7. The apparatus of claim 1, wherein the balancer comprises at least one switch configured to electrically connect the output signals of the cross-coupled latch to each other until at least one of the first or the second input signal transitions.

8. The apparatus of claim 7, wherein the at least one switch comprises a transistor including a source/drain coupled to an output of the latch, a drain/source coupled to another output of the latch, and a gate coupled to one of the first or the second input signal.

9. The apparatus of claim 8, wherein the at least one switch comprises a first transistor and a second transistor serially connected to each other between the outputs of the latch, wherein the first transistor includes a gate coupled to one of the first or the second input signal, and wherein the second transistor includes a gate coupled to another of the first or the second input signal.

10. The apparatus of claim 1, wherein the balancer comprises switches configured to electrically connect the output signals of the latch to a voltage source until at least one of the first or the second input signal transitions.

11. The apparatus of claim 1, further comprising an output circuit configured to maintain the output signals of the latch of the phase detection circuit and provide at least one phase detection signal indicative of the phase difference.

12. The apparatus of claim 11, wherein the output circuit comprises a cross-coupled latch cascaded with the latch of the phase detection circuit.

13. The apparatus of claim 11, wherein the output circuit comprises a first group of transistors serially connected between a first latch output of the latch and ground, and a second group of transistors serially connected between a second latch output of the latch and ground, the gates of the first group transistors being connected to the second latch output, the gates of the second group transistor being connected to the first latch output.

14. The apparatus of claim 13, wherein the cross-coupled latch comprises an RS NAND latch.

15. An apparatus comprising:
   a phase detection circuit configured to receive a first and a second input signal, wherein the phase detection circuit is configured to detect a phase difference between the first and the second input signal and to indicate the detection of the phase difference with output signals, the phase detection circuit comprising a cross-coupled latch, wherein the output signals of the phase detection circuit are directly coupled to inputs of the phase detection circuit, wherein the cross-coupled latch comprises an RS NOR latch;
   a balancer independent of the phase detection circuit, the balancer having at least one input coupled to at least one of the first or the second input signal, wherein the balancer is configured to substantially equalize the voltage levels of the output signals of the cross-coupled latch of the phase detection circuit in response to the at least one of the first or the second input signal; and
   an output circuit configured to maintain the output signals of the latch of the phase detection circuit and provide at least one phase detection signal indicative of the phase difference, wherein the output circuit comprises a first group of transistors serially connected between a first latch output of the latch and ground, and a second group of transistors serially connected between a second latch output of the latch and ground, the gates of the first group transistors being connected to the second latch output, the gates of the second group transistor being connected to the first latch output.

16. An apparatus comprising:
   a phase detection circuit configured to detect a phase difference between two clock signals, the phase detection circuit comprising a cross-coupled latch configured to receive the two clock signals and generate a first latch output signal and a second latch output signal in response to the two clock signals to indicate the detection of the phase difference, wherein output signals of the phase detection circuit are directly coupled to inputs of the phase detection circuit; and
   voltage equalizing means for electrically coupling the outputs of the cross-coupled latch to each other in direct response to at least one of the two clock signals that have not passed through the cross-coupled latch, thereby substantially equalizing the voltage levels of the first and second latch output signals of the cross-coupled latch before the phase detection circuit detects the phase difference between the two clock signals, wherein the voltage equalizing means is independent of the phase detection circuit.

17. The apparatus of claim 16, wherein the voltage equalizing means comprises at least one switch configured to electrically connect the first and second latch outputs to each other until at least one of the clock signals transitions.

18. A method comprising:
receiving two clock signals in a phase detection circuit comprising a cross-coupled latch, the cross-coupled latch comprising a first latch output and a second latch output, wherein a phase detection is indicated by relative output states of the first latch output and the second latch output, wherein output signals of the phase detection circuit are directly coupled to inputs of the phase detection circuit; and
electrically connecting the first and second latch outputs to each other in direct response to at least one of the two clock signals that have not passed through the cross-coupled latch, and independently of the cross-coupled latch before each instance of the cross-coupled latch responding to the two clock signals.

19. The method of claim 18, wherein electrically connecting the first and second latch outputs to each other comprises electrically shorting the first and second latch outputs until at least one of the two clock signals transitions.

20. The method of claim 19, wherein electrically connecting the first and second latch outputs to each other comprises electrically shorting the first and second latch outputs until a leading one of the two clock signals transitions.

21. The apparatus of claim 16, wherein the voltage equalizing means receives one or more of the two clock signals as an input to the voltage equalizing means.

22. The method of claim 18, wherein electrically connecting the first and second latch outputs comprises electrically connecting the first and second latch outputs by a balancer that receives one or more of the two clock signals as an input to the balancer.

* * * * *